United States Patent
Kryskowski

(10) Patent No.: US 9,954,154 B2
(45) Date of Patent: Apr. 24, 2018

(54) SUPERLATTICE QUANTUM WELL THERMOELECTRIC GENERATOR VIA RADIATION EXCHANGE AND/OR CONDUCTION/CONVECTION

(71) Applicant: UD HOLDINGS, LLC, Dearborn Heights, MI (US)

(72) Inventor: David Kryskowski, Ann Arbor, MI (US)

(73) Assignee: UD Holdings, LLC, Dearborn Heights, MI (US)

( * ) Notice: Subject to any disclaimer, the term of this patent is extended or adjusted under 35 U.S.C. 154(b) by 0 days.

(21) Appl. No.: 14/391,521

(22) PCT Filed: Apr. 10, 2013

(86) PCT No.: PCT/US2013/035971
§ 371 (c)(1),
(2) Date: Oct. 9, 2014

(87) PCT Pub. No.: WO2013/155181
PCT Pub. Date: Oct. 17, 2013

(65) Prior Publication Data
US 2015/0068576 A1 Mar. 12, 2015

Related U.S. Application Data

(60) Provisional application No. 61/622,155, filed on Apr. 10, 2012, provisional application No. 61/752,143, filed on Jan. 14, 2013.

(51) Int. Cl.
*H01L 35/02* (2006.01)
*H01L 35/32* (2006.01)

(52) U.S. Cl.
CPC ............. *H01L 35/02* (2013.01); *H01L 35/32* (2013.01)

(58) Field of Classification Search
CPC .. H01L 35/02; H01L 35/32; G01J 5/12; G01J 5/123; G01J 5/02; G01J 5/022;
(Continued)

(56) References Cited

U.S. PATENT DOCUMENTS

| 5,436,476 A | 7/1995 | Hynecek |
| 5,550,387 A | 8/1996 | Elsner et al. |
| 5,914,488 A * | 6/1999 | Sone ............ G01J 5/04 250/332 |

(Continued)

FOREIGN PATENT DOCUMENTS

| CN | 1645013 A | 7/2005 |
| CN | 1744338 A | 3/2006 |

(Continued)

OTHER PUBLICATIONS

Michael Patra, "Introduction to Semiconductor Superlattices", pp. 1-9 http://wwwnlds.physik.tu-berlin.de/~patra/dynamics/sl0/.*

(Continued)

*Primary Examiner* — Devina Pillay
*Assistant Examiner* — Daniel P Malley, Jr.
(74) *Attorney, Agent, or Firm* — Brooks Kushman P.C.

(57) ABSTRACT

In at least one embodiment a thermoelectric generator is provided. The thermoelectric generator includes a cap and a thermopile. The cap is coupled to a heat generating device for receiving thermal energy therefrom. The thermopile includes superlattice quantum well materials and an absorber for contacting the cap to receive the thermal energy and to generate an electrical output to one of store the electrical output on a storage device and power a first device with the electrical output in response to the thermal energy.

20 Claims, 12 Drawing Sheets

(58) Field of Classification Search
CPC .. G01J 5/0225; G01J 5/04; G01J 5/041; G01J 2005/123; G01J 2005/126
See application file for complete search history.

(56) References Cited

U.S. PATENT DOCUMENTS

| | | | |
|---|---|---|---|
| 6,060,656 A | | 5/2000 | Dresselhaus et al. |
| 6,203,869 B1* | | 3/2001 | Dougherty .............. H01L 23/26 257/E23.137 |
| 6,339,187 B1 | | 1/2002 | Inoue |
| 6,690,014 B1 | | 2/2004 | Gooch et al. |
| 7,038,234 B2 | | 5/2006 | Ghamaty et al. |
| 7,755,048 B2 | | 7/2010 | Hsu |
| 8,158,943 B2 | | 4/2012 | Kryskowski et al. |
| 8,803,127 B2 | | 8/2014 | Kryskowski |
| 2005/0218328 A1* | | 10/2005 | Suzuki ...................... G01J 5/02 250/353 |
| 2006/0042675 A1 | | 3/2006 | Tateyama et al. |
| 2009/0095908 A1 | | 4/2009 | Bollhorst |
| 2010/0031992 A1* | | 2/2010 | Hsu .......................... G01J 5/12 136/223 |
| 2010/0051810 A1* | | 3/2010 | Herrmann ........... B81C 1/00293 250/338.1 |
| 2011/0168978 A1 | | 7/2011 | Kochergin |
| 2011/0174978 A1 | | 7/2011 | Forg et al. |
| 2011/0175145 A1* | | 7/2011 | Tsuji ........................ G01J 5/02 257/252 |
| 2013/0248712 A1 | | 9/2013 | Abdolvand et al. |

FOREIGN PATENT DOCUMENTS

| | | |
|---|---|---|
| CN | 101278400 A | 10/2008 |
| CN | 102197290 A | 9/2011 |
| JP | 2003282961 A | 10/2003 |
| JP | 2006332398 A | 12/2006 |
| JP | 2010204112 A | 9/2010 |
| JP | 2012058212 A | 3/2012 |
| WO | 2010120447 A1 | 10/2010 |
| WO | 2012051060 A2 | 4/2012 |
| WO | 2013155181 A1 | 10/2013 |

OTHER PUBLICATIONS

International Search Report and Written Opinion for corresponding Appln. No. PCT/US2013/035971, dated Jul. 26, 2013, 11 pages.
International Preliminary Report for corresponding Appln. No. PCT/US2013/035971, dated Mar. 21, 2014, 19 pages.
International Search Report and Written Opinion for Application No. PCT/US2014/065492, dated Mar. 13, 2015, 12 pages.
International Preliminary Report for Application No. PCT/US2014/065492, dated May 26, 2016, 9 pages.
Chinese Office Action for Application No. 201380017756.0, dated Jul. 5, 2016, 10 pages.
Chinese Office Action and English translation for Application No. 201380017756.0, dated Mar. 8, 2017, 10 pages.

* cited by examiner

US 9,954,154 B2

SUPERLATTICE QUANTUM WELL THERMOELECTRIC GENERATOR VIA RADIATION EXCHANGE AND/OR CONDUCTION/CONVECTION

CROSS-REFERENCE TO RELATED APPLICATION

This application is the U.S. national phase of PCT Application No. PCT/US2013/035971 filed on Apr. 10, 2013, which claims the benefit of U.S. provisional application Ser. No. 61/622,155 filed on Apr. 10, 2012 and U.S. provisional application Ser. No. 61/752,143 filed on Jan. 14, 2013, the disclosures of which are hereby incorporated by reference in their entirety.

TECHNICAL FIELD

Embodiments described herein generally relate to a superlattice quantum well Radiative ThermoElectric Generator (RTEG) and a superlattice quantum well ThermoElectric Generator (TEG) and method(s) of forming the same.

BACKGROUND

An IR detector is generally defined as a photodetector that responds to IR radiation. One type of an infrared detector is a thermal based detector. A thermal based detector may be implemented within a camera to generate an image of an object formed on the thermal properties generally associated with such an object. Thermal based detectors are known to include bolometers, microbolometers, pyroelectric, and thermopiles. The thermopiles may generate a DC voltage for sensing and/or electrical generation. Thermopiles may include a number of thermocouples that convert radiative energy from the object into electrical energy. The following references may be relevant to the present disclosure: U.S. Pat. No. 5,436,476 to Hynecek, U.S. Pat. No. 5,550,387 to Elsner et al., U.S. Pat. No. 6,060,656 to Dresselhaus et al., U.S. Pat. No. 6,690,014 to Gooch et al., U.S. Pat. No. 7,038,234 to Ghamaty et al., U.S. Pat. No. 7,755,048 to Hsu, and U.S. Patent Publication No. 2011/0168978 to Kochergin.

SUMMARY

In at least one embodiment a thermoelectric generator is provided. The thermoelectric generator includes a cap and a thermopile. The cap is coupled to a heat generating device for receiving thermal energy therefrom. The thermopile includes superlattice quantum well materials and an absorber for contacting the cap to receive the thermal energy and to generate an electrical output to one of store the electrical output on a storage device and power a first device with the electrical output in response to the thermal energy.

BRIEF DESCRIPTION OF THE DRAWINGS

The embodiments are pointed out with particularity in the appended claims. However, other features of the various embodiments will become more apparent and will be best understood by referring to the following detailed description in conjunction with the accompany drawings in which:

DETAILED DESCRIPTION

Figure 1:
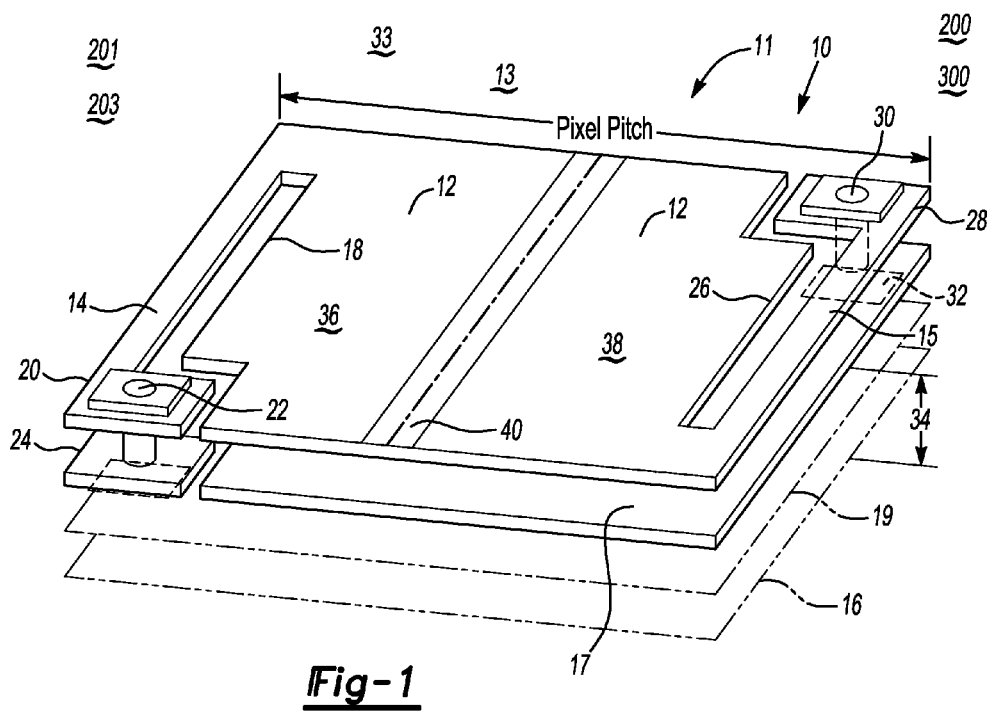
FIG. 1 depicts a thermal detector in accordance to one embodiment.

Detailed embodiments are disclosed herein. However, it is to be understood that the disclosed embodiments are merely exemplary and such embodiments may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the one or more embodiments.

Various embodiments as disclosed herein, generally provide for, a thermoelectric generator (or radiative thermoelectric generator) that include a wafer level cap that receives thermal energy from a heat generating source (e.g., sun, solar, hot pipe, muffler, etc.). The wafer level cap may or may not be coupled to the heat generating source. In a TEG implementation, the wafer level cap may be coupled to the heat generating source (e.g., hot pipe, muffler, etc.) such that a portion of a thermopile is attached to the cap to enable thermal transfer to superlattice quantum well materials which convert the received thermal energy into an electrical output for storage on a storage device. In an RTEG implementation, the superlattice quantum well materials may receive the directly or indirectly from the sun or other heat generating source of electromagnetic radiation to produce electrical energy to power another device (or first device). With the RTEG implementation, the cap may not be coupled to the heat generating source. In addition, a reflector is positioned within the thermoelectric generator and includes Palladium or various alloys of Palladium. These aspects and others will be discussed in more detail herein.

The various embodiments disclosed herein, may provide, but not limited to, a plurality of detectors that may be positioned in an array of M×N columns exchanging energy with the environment to either generate electricity or pump heat from or two the environment to the detectors. In another embodiment, the plurality of detectors may be used to capture (or sense) thermal energy from a light source (or scene) and to provide an electrical output based on the sensed thermal energy for purposes of energy storage. The detector generally includes, among other things, an absorber, a substrate, and/or at least one arm. The absorber and/or the at least one arm may be suspended over the substrate. It is contemplated that the absorber and/or the at least one arm may be constructed of a superlattice quantum well thermoelectric based material. Such a construction may enable the absorber and the at least one arm to achieve increased Seebeck effect, low resistivity, and adequate thermal conductivity. These aspects may improve detector performance. It is also contemplated that the absorber and/or the arm may be encapsulated by, but not limited to, various silicon based dielectric materials such as silicon nitride and/or silicon dioxide. The encapsulation of the superlattice quantum well thermoelectric materials with the silicon based dielectric materials may stress compensate the detector and may increase the structural integrity of the detector while the absorber and/or the at least one arm are suspended over the substrate.

FIG. 1 depicts a detector 10 in accordance to one embodiment of the present invention. The detector 10 may be one of many arranged in an M×N array 18 that is encapsulated in a vacuum 11 that may include an optical concentrator to form a Radiative ThermoElectric Generator (RTEG) 200. The RTEG 200 is generally arranged to sense thermal energy that is received directly or indirectly from the sun or other heat generating source of electromagnetic radiation to produce electrical energy to power another device and/or to store electrical energy on a storage device 201 such as a battery in response to the thermal energy. The RTEG 200 will be discussed in more detail below.

It is also recognized that the detector 10 may also be one or many arranged in the M×N array 18 to form a ThermoElectric Generator (TEG) 300. The TEG 300 may or may not be encapsulated in the vacuum 11. The TEG 300 generally includes a portion thereof that is coupled to a heat generating source to receive thermal energy. The electrical energy may be used for generating electrical energy in response to the thermal energy for powering another device 201 and/or for storing electrical energy on the storage device 203 such as a battery. The TEG 300 will also be discussed in more detail below.

Each detector 10 is configured to absorb/emit electromagnetic radiation (hereafter radiation) from and/or to the environment outside of the detector 10 and to change its voltage potential based on an amount of energy exchanged from the environment. A readout integrated circuit (ROIC) 19 (or readout circuit) is positioned below each detector 10. The ROIC 19 may electrically output the voltage potential for each detector 10. It is contemplated that the ROIC 19 may comprise electrical connection lines or various electronics as generally found in complementary metal oxide semiconductor (CMOS) integrated circuits. Each detector 10 may be micro-machined on top of the ROIC 19. The embodiments disclosed herein may also be incorporated in a detector as set forth in PCT application Serial No. PCT/US2010/028293 ("the '293 application"), entitled "INFRARED DETECTOR" filed on Mar. 23, 2010, which is hereby incorporated by reference in its entirety. The detector 10 is generally arranged as a micro-bridge. The detector 10 may be formed as a thermopile.

While the detector 10 as noted above may be used to exchange radiation from the environment or with objects that are either much hotter or much cooler than the substrate, the detector 10 also receives thermal energy from a light source, such as thermal energy received directly or indirectly from the sun. The detector 10 provides a voltage output in response to the thermal energy for providing electrical energy to power another device 201 or for storing electrical energy on a storage device 203 such as a battery or other suitable mechanism.

The detector 10 includes an absorber 12, a first arm 14, a second arm 15, and a substrate 16. The absorber 12, the first arm 14, and the second arm 15 may comprise thermoelectric materials and be formed with superlattice quantum well materials which will be described in more detail below. The substrate 16 may comprise, but not limited to, a monocrystalline silicon wafer or a silicon wafer. The substrate 16 may be connected to the ROIC 19. The absorber 12, the first arm 14, and the second arm 15 are generally suspended over the ROIC 19. The first arm 14 is positioned next to the absorber 12 and may extend, if desired (attached or unattached) along a first side 18 of the absorber 12 and terminate at a terminal end 20. A post 22 is coupled to the terminal end 20 of the first arm 14.

An input pad 24 of the ROIC 19 receives the post 22. The post 22 provides an electrical connection from the absorber 12 to the ROIC 19. In a similar manner, the second arm 15 is positioned next to the absorber 12 and may extend, if desired (attached or unattached) along a second side 26 of the absorber 12 and terminate at a terminal end 28. A post 30 is coupled to the terminal end 28 of the second arm 16. An input pad 32 of the ROIC 19 receives the post 30. The post 30 provides an electrical connection from the absorber 12 to the ROIC 19. In general, the posts 22 and 30 cooperate with one another to support the absorber 12, the first arm 14, and the second arm 15 above the substrate 16 (e.g., suspend the absorber 12, the first arm 14, and the second arm 15 above the substrate 16).

The absorber 12 is generally configured to exchange radiation from a scene and to change temperature in response thereto. The detector 10 may change its voltage potential based on the amount of radiation received from the scene. A reflector 17 is positioned between the absorber 12 and the ROIC 19. The reflector 17 may enhance the ability for the absorber 12 to absorb the radiation. For example, any thermal energy that is not absorbed by the absorber 12 may be reflected off of the reflector 17 and back to the absorber 12. The first arm 14 and the second arm 15 may be horizontally displaced from the absorber 12 to thermally isolate the absorber 12. It may be desirable to reduce thermal conduction to increase detector 10 performance. In addition, the absorber 12, first arm 14, and the second arm 15 may be vertically displaced from the substrate 16 and define an isolation gap 34 (or cavity) therebetween for thermally isolating one detector from additional detectors positioned within the array.

The detector 10 may comprise P-type materials on one side and N-type materials on another side. For example, the absorber 12 may be considered to include a first portion 36, a second portion 38, and an active region 40. The first arm 14 and the first portion 36 may be constructed from P-type materials. The second arm 15 and the second portion 38 may be constructed from N-type materials. The active region 40 electrically couples the P-type based elements (first arm 14 and the first portion 36) to the N-type based elements (second arm 15 and the second portion 38). The active region 40 includes a metal film and may have a gap formed therebetween.

Figure 2:
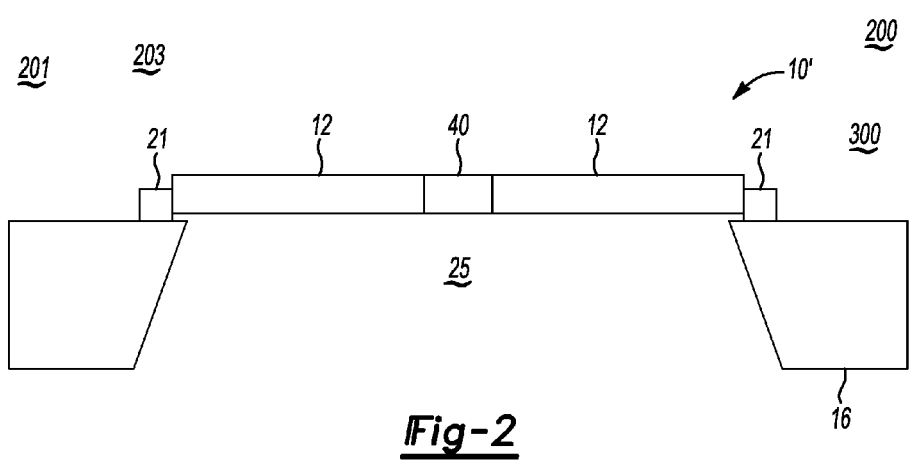
FIG. 2 depicts a cross-sectional view of a thermal detector including only an absorber in accordance to one embodiment.

FIG. 2 depicts a cross-sectional view of a thermal detector 10' including only an absorber 12 in accordance to one embodiment. An electrical connection 21 is formed on each side of the detector 10' for providing an electrical output therefrom to a readout circuit (not shown). The absorber 12 is generally positioned (or suspended) over a cavity 25. It is recognized that the detector 10' may also be arranged in the array 18 to form the RTEG 200 or the TEG 300.

It is known to implement a detector that includes arms and an absorber being suspended over the substrate. In this conventional approach, the arms thermally isolate the absorber, which in turn causes a reduction in thermal conductance from the absorber to the substrate. By reducing thermal conductance between the absorber 12 and the arms 14, 15, heat transfer/leakage may be reduced and an improvement in IR detector performance may be realized. This conventional approach generally forms the thermoelectric structure (e.g., the arms and the absorber) with one or more of the following materials: bismuth-telluride, antimony-telluride, lead telluride, polysilicon, polysilicon-germanium, skutterudite, a nano-composite material, and a superlattice structure in order to achieve low thermal conductivity. By forming the detector with one or more of the aforementioned materials and by suspending the absorber and the arms, these conditions may cause the absorber and/or the arms to warp or buckle which may lead to a detector failure.

The embodiments described herein recognize, inter alia, that the absorber 12 and/or the arms 14, 15 as used in connection with an electrical generation support device that may be constructed with superlattice quantum well thermoelectric materials that may enable the detector 10 to realize adequate electrical output performance characteristics. Moreover, the embodiments disclosed herein contemplate encapsulating the superlattice quantum well materials of the absorber 12 and/or the arms 14, 15 with silicon nitride or silicon dioxide. The encapsulation of the absorber 12 and/or the arms 14, 15 with the silicon based materials may compensate or equalize stress that is induced during the deposition of the superlattice quantum well materials and increase the mechanical strength of the detector 10 while portions of the detector 10 are suspended over the ROIC 16. By increasing the mechanical strength of the detector 10 and by stress compensating the detector 10, warping or buckling of the detector 10 may be minimized or eliminated altogether. The embodiments further recognize that the absorber 12, the first arm 14, and the second arm 15 of the detector 10 may be constructed from superlattice (e.g., silicon/-silicon-germanium ($Si/Si_xGe_{x-1}$) where x may be an integer or a non-integer (hereafter "Si/SiGe")) quantum well thermoelectric materials. The first arm 14 and the first portion 36 may be formed of a P type superlattice quantum well thermoelectric material. The second arm 15 and the second portion 38 may be formed of an N type superlattice quantum well material.

By utilizing a superlattice quantum well thermopile 10 that includes the absorber 12 and/or arms 14, 15, such a condition minimizes thermal loss from the absorber 12 through the arms 14, 15 to substrate 16 and/or to any devices positioned proximate to the absorber 12, thereby thermally isolating the absorber 12 from a surrounding device. When radiation from the environment heats or cools the absorber 12, the detector 10 generates an output voltage that is proportional to the temperature difference between the absorber 12 and the substrate 16. Accordingly, if the absorber 12 was formed of material containing a high thermal conduction, detector performance may be adversely affected due to the leakage of thermal energy from the absorber 12. Because the superlattice quantum well material provides a low thermal conductivity, adequate thermal isolation at the absorber 12 may be achieved, thereby improving detector performance. In addition, superlattice quantum well materials also provide for a high Seebeck coefficient and high electrical conductivity which enables the detector 10 to provide an output voltage with a high signal-to-noise ratio which provides for a high fidelity representation of the amount of radiation sensed by absorber 12. Generally, the detector 10 is capable of providing a flow of current into the milliamp range.

While conventional detectors are known to include bismuth-telluride, antimony-telluride, lead telluride, polysilicon, polysilicon-germanium, skutterudite, a nano-composite material, and a superlattice structure as a means to achieve low thermal conductivity (i.e., minimize heat dissipation or transfer from the detector) for a suspended absorber and/or suspended arms, such materials may not provide sufficient mechanical support or not be properly stress compensated. It can be seen (as shown below) that the use of superlattice quantum well thermoelectric materials in the detector 10 may provide for adequate thermal conductivity and may serve as an alternate to the types of materials in conventional detectors.

In general, in order to obtain a large response from a thermopile detector 10, the thermal conductance from the detector 10 (e.g., absorber 12 and/or the arms 14, 15) to the thermal ground plane (e.g., within the substrate 16), $G_K$, should be small. Therefore, the thermal conductivity of the thermopile material should be as small as possible. Conclusively, it may be desirable for the material within the detector 10 to have (a) a high Seebeck coefficient and (b) a high electrical conductivity. A figure of merit for a thermopile made of n-type and p-type materials is defined as follows:

$$Z = \frac{(\alpha_p - \alpha_n)^2}{[(r_p k_p)^{1/2} + (r_n k_n)^{1/2}]^2} \quad (1)$$

Where:

$\alpha_p$ = Seebeck constant for $p$-type material in $\frac{\text{Volts}}{K}$ $\alpha_n$ = Seebeck constant for $n$-type material in $\frac{\text{Volts}}{K}$ $k_p$ = Thermal conductivity for $p$-type material in $\frac{\text{Watt}}{m \cdot K}$ $k_n$ = Thermal conductivity for $n$-type material $\frac{\text{Watt}}{m \cdot K}$ $\rho_p$ = Resistivity of $p$-type material in $\Omega \cdot m$ $\rho_n$ = Resistivity of $n$-type material in $\Omega \cdot m$ This figure of merit assumes that the arms 14, 15 have the same length and cross-sectional area. Table 1 (below) shows this new figure of merit for a selected group of materials. Performance improvement based on thermopile material choice may be evident.

Thermopile Material Type

TABLE 1

Thermocouple Material Performance Comparison

|  | polysilicon | $Si_{0.7}Ge_{0.3}$ polysilicon | $Bi_2Te_3/Sb_2Te_3$ | QW Si/SiGe |
|---|---|---|---|---|
| post-CMOS Compatible | NO | YES | YES | YES |
| Z K$^{-1}$ | $2.3 \times 10^{-4}$ | $1.0 \times 10^{-3}$ | $2.5 \times 10^{-3}$ | 0.31 |

For small pitch (e.g., ≤50 μm) arrays, $Bi_2Te_3$ and np $Si_{0.7}Ge_{0.3}$ may not be practical choices for the thermoelectric materials. The reason for rejecting standard np polysilicon is that its thermal conductivity may be too large to achieve reasonable detector sensitivities. Moreover, the deposition temperature may be too high for post Complementary Metal-Oxide-Semiconductor (CMOS) compatibility. The measurements of interest (e.g., resistivity, Seebeck coefficient, and thermal conductivity) for quantum well Si/SiGe, $Bi_2Te_3$, $Si_{0.7}Ge_{0.3}$ and standard np polysilicon are given below in the Table 2:

TABLE 2

$Bi_2Te_3/Sb_2Te_3$ Parameters, Polysilicon Parameters, QW Parameters

| Thermopile Material Type | Resistivity μΩ · m | Seebeck $\frac{\mu V}{K}$ | k $\frac{W}{m \times K}$ |
|---|---|---|---|
| QW Si/SiGe (NP) | 0.1 to 10.0 | 1200 | 3-5 |
| $Bi_2Te_3$ (N) | 12.6 | −248 | 1.3 |
| $Sb_2Te_3$ (P) | 12.6 | 188 | 1.8 |

TABLE 2-continued $Bi_2Te_3/Sb_2Te_3$ Parameters, Polysilicon Parameters, QW Parameters

| Thermopile Material Type | Resistivity μΩ · m | Seebeck $\frac{\mu V}{K}$ | k $\frac{W}{m \times K}$ |
|---|---|---|---|
| $Bi_2Te_3$-$Bi_2Se_3$(N) | 15 | −200 | 1.2 |
| $Bi_2Te_3$-$Sb_2Te_3$(P) | 12 | 240 | 1.2 |
| $Si_{0.7}Ge_{0.3}$ polysilicon (NP) | 10 to 1000 | 100 to 500 | 5 |
| polysilicon (NP) | 10 to 1000 | 100 to 500 | 23 |

Although $Bi_2Te_3$ and $Sb_2Te_3$ can produce high performing thermopile detectors, choosing $Bi_2Te_3$ and $Sb_2Te_3$ may have several drawbacks. For example, (1) detector resistance can fall around 3 kΩ and a consequence is that electronic noise may dominate; (2) deposition and etching of $Bi_2Te_3$ and $Sb_2Te_3$ is being heavily researched and may not be mature yet (however, $Bi_2Te_3$ and $Sb_2Te_3$ can be deposited at low temperatures, patterned and dry etched); and (3) the thermoelectric properties of $Bi_2Te_3$ and $Sb_2Te_3$ may vary greatly if the stoichiometry is not maintained which implies tight controls on the deposition and non-conventional deposition processes such as co-evaporation. In contrast, Si/SiGe superlattice quantum wells comprise widely used materials in CMOS and Micromechanical Systems (MEMS) processing. Moreover, stoichiometry may not be an issue in the Si/SiGe superlattice quantum well implementation, which may allow deposition to be conducted with less critical, controls.

The thermal conductivity of $Bi_2Te_3$ thin films has been measured to be $$1.2 \frac{W}{mK}$$

which may be close the thermal conductivity of PECVD silicon nitride, where thermal conductivity may be $$\leq 1.18 \frac{W}{mK}.$$

The thermal conductivity of bulk $Bi_2Te_3$ may be $$1.7 \frac{W}{mK}$$

and the lower thermal conductivity may be a common effect in very thin films. The thermal conductivity of $Bi_2Te_3$ may fall further as the film thickness falls below 0.5 μm.

As shown above in Table 2, $Bi_2Te_3$ and silicon nitride may have similar thermal conductivities. Due to this fact, adding significant amounts of silicon nitride to the arms and/or to the absorber when formed of $Bi_2Te_3$ may cause a decrease in detector performance. Due to this condition, conventional implementations tend to avoid adding silicon nitride or silicon dioxide to bismuth telluride based detectors. In contrast, the arms 14, 15 and/or the absorber 12 of the present disclosure may include various amounts of silicon nitride and/or silicon dioxide with quantum well Si/SiGe.

This condition may not cause a significant loss in detector performance because the thermal conductivity of quantum well Si/SiGe may be ≈3-4 times greater than that of silicon nitride. As such, the addition of the thermal conductivity added by the silicon nitride may be negligible in terms of the overall increase in thermal conductivity added to the Si/SiGe quantum well with the silicon nitride. For example, the thermal conductivity of Si/SiGe quantum well may be between 3-5 W/mK. The thermal conductivity of the silicon nitride may be 1.2 W/mK. Adding moderate amounts of the silicon nitride may not affect detector performance because the thermal conductivity of the Si/SiGe quantum well may dominate. In general, the thickness of the silicon nitride may be anywhere from 10% to 100% of the overall thickness of the quantum well arms 14, 15. For example, if the arms 14, 15 are 1000 Å thick, then the thickness of the silicon nitride may be in the range of 100 Å to 1000 Å. In general, the largest component of the total thermal conductance is due to the arms 14, 15.

Conventional based detectors that may implement a suspended arm and absorber structure tend to avoid encapsulating the arms and/or the absorber with silicon nitride when bismuth telluride materials are used to form the films in the detector to prevent an increase in thermal conductivity. However, it has been discovered as set forth herein, that by removing the encapsulated silicon nitride, such a condition may aid to the warping and/or buckling of the detector 10 as noted above. For example, the removal of the encapsulated silicon nitride may decrease detector mechanical strength and remove the capability to stress compensate. Unless the detector is stress compensated, the detector may warp and become non-functional.

Another useful dielectric in MEMS processing may be silicon dioxide. When deposited, silicon dioxide may normally be in compressive stress, this material in conjunction with silicon nitride can be used to compensate for stress and additionally may be an effective etch stop. The thermal conductivity of thin film silicon dioxide may be $$\leq 2.0 \frac{W}{mK}.$$

Figure 3:
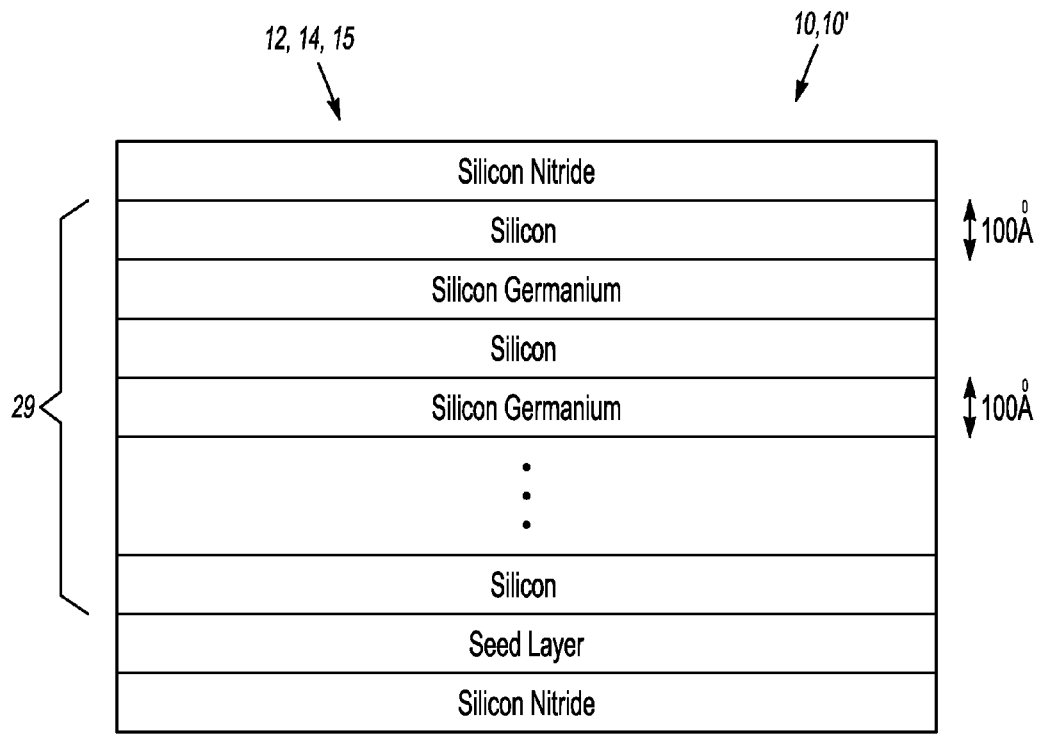
FIG. 3 depicts a superlattice quantum well thermoelectric material that is encapsulated by silicon based materials in accordance to one embodiment.

FIG. 3 depicts a superlattice quantum well thermoelectric material that is encapsulated by silicon based materials. In general, the superlattice quantum well layers of the absorber 12, and/or the arms 14, 15 and may be sandwiched between a top layer of silicon nitride and a bottom layer of silicon nitride (or sandwiched between a top layer of silicon dioxide and a bottom layer of silicon dioxide or sandwiched between a top layer of silicon nitride and a bottom layer of silicon dioxide (or vice versa) (see, element 29 in FIG. 3 alternating layers of Si/SiGe (e.g., barrier or conducting layers where the barrier layers comprise Si and the conducting layers comprise SiGe)). In reference to FIGS. 1-2, the first arm 14 and the first portion 36 may be formed a p-type superlattice quantum well that is encapsulated by silicon nitride. Conversely, the second arm 15 and the second portion 38 may formed of an n-type superlattice quantum well that is encapsulated by silicon nitride. A seed layer (not shown) is positioned above the silicon nitride layer and may be <100> monocrystalline silicon.

Figure 4A:
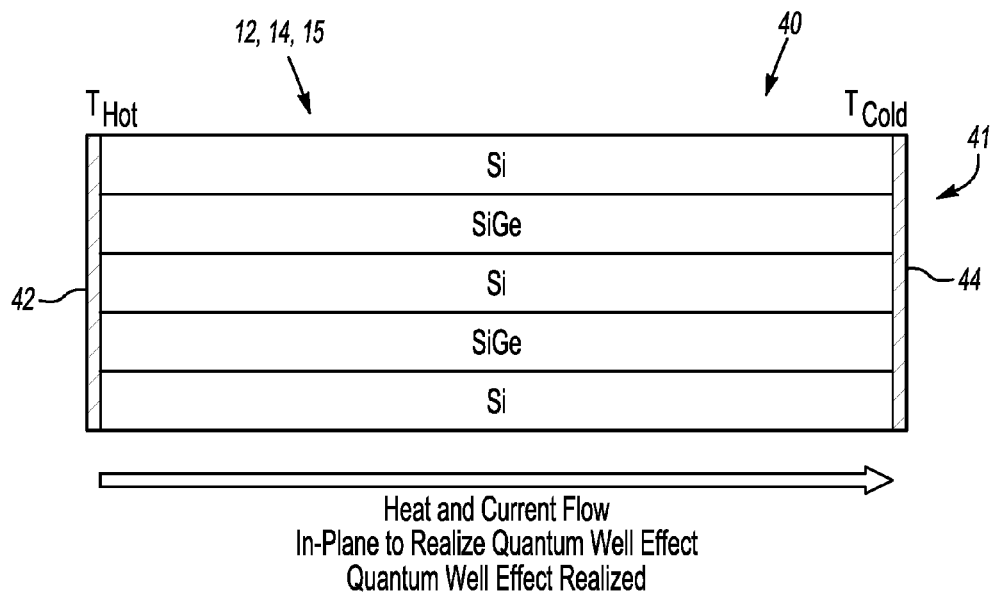
FIGS. 4A-4B depict one embodiment that realizes a quantum well and another embodiment that does not realize a quantum well effect; respectively.
Figure 4B:
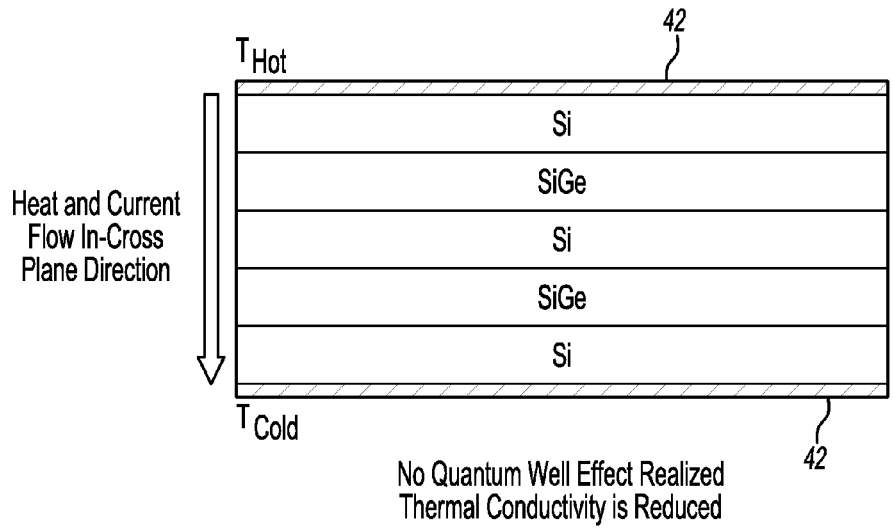

FIGS. 4A-4B depict one embodiment that realizes a quantum well effect and another embodiment that does not realize a quantum well effect, respectively. In reference to FIG. 4A a portion of the detector (e.g., first arm 14, second arm 15, and/or absorber 16) may include any number of films 41. The films 41 may comprise alternating layers of Si and Si/Ge (e.g., superlattice of Si and Si/Ge). Each layer of Si and Si/Ge may have a thickness of ≤200 Å. The total thickness of the quantum well material within the detector 10 may be ≤10000 Å. A first contact 42 is positioned on one end and a second contact 44 is positioned on another end. The first contact 42 may be horizontally positioned away from the second contact 44. By positioning the first contact 42 horizontally away from the second contact 44, small amounts of current and heat may flow laterally, from the first contact 42 through the layers of Si/SiGe to the second contact 44 (e.g., in plane). Such a condition enables the first arm 14, the second arm, and/or the absorber 16 to realize the quantum well effect.

One approach to increasing the performance of thermoelectric materials may be to form compositionally modulated materials, mainly by quantum well confinement of carriers in the active layers in a multilayer film by adjacent barrier layers. The approach as disclosed herein is to enclose each electrically active layer by a material which has a band offset sufficient to form a barrier for the charge carriers. An improvement in the thermoelectric properties (e.g., Seebeck effect, electrical resistivity and thermal conductivity) is expected to follow from an increase in the density of states (e.g., increased Seebeck), an increase in carrier mobility (e.g., lower electrical resistance), and inhibited phonon flow due to strain between the quantum well and barrier layers (e.g., lower thermal conductivity). The layer thicknesses may be ≤200 Å.

FIG. 4B depicts that the first contact 42 is vertically displaced from the second contact 44. Small amounts of current and heat may flow in a cross-plane direction which is perpendicular to the in-plane direction of the quantum well configuration noted above from the first contact 42 through the layers of Si/SiGe to the second contact 44. While thermal conductivity may be reduced, this implementation fails to realize the quantum well effect.

Figure 5:
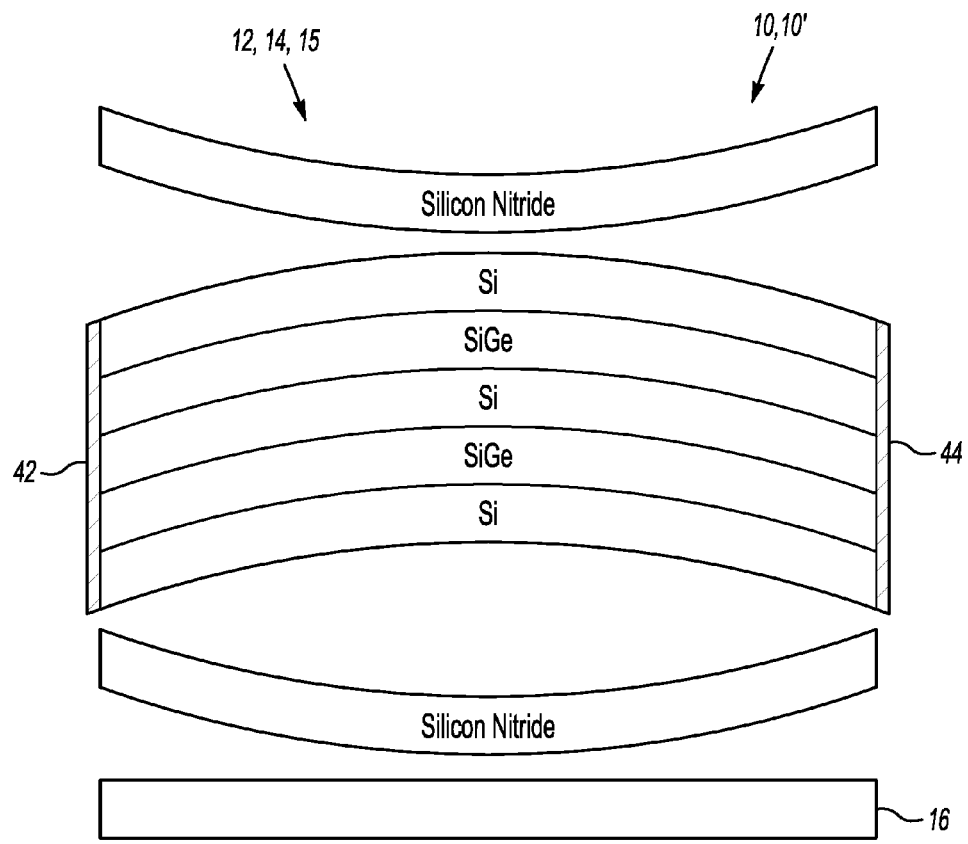
FIG. 5 depicts various stresses caused by layers of silicon nitride and the superlattice quantum well materials during deposition.
Figure 6:
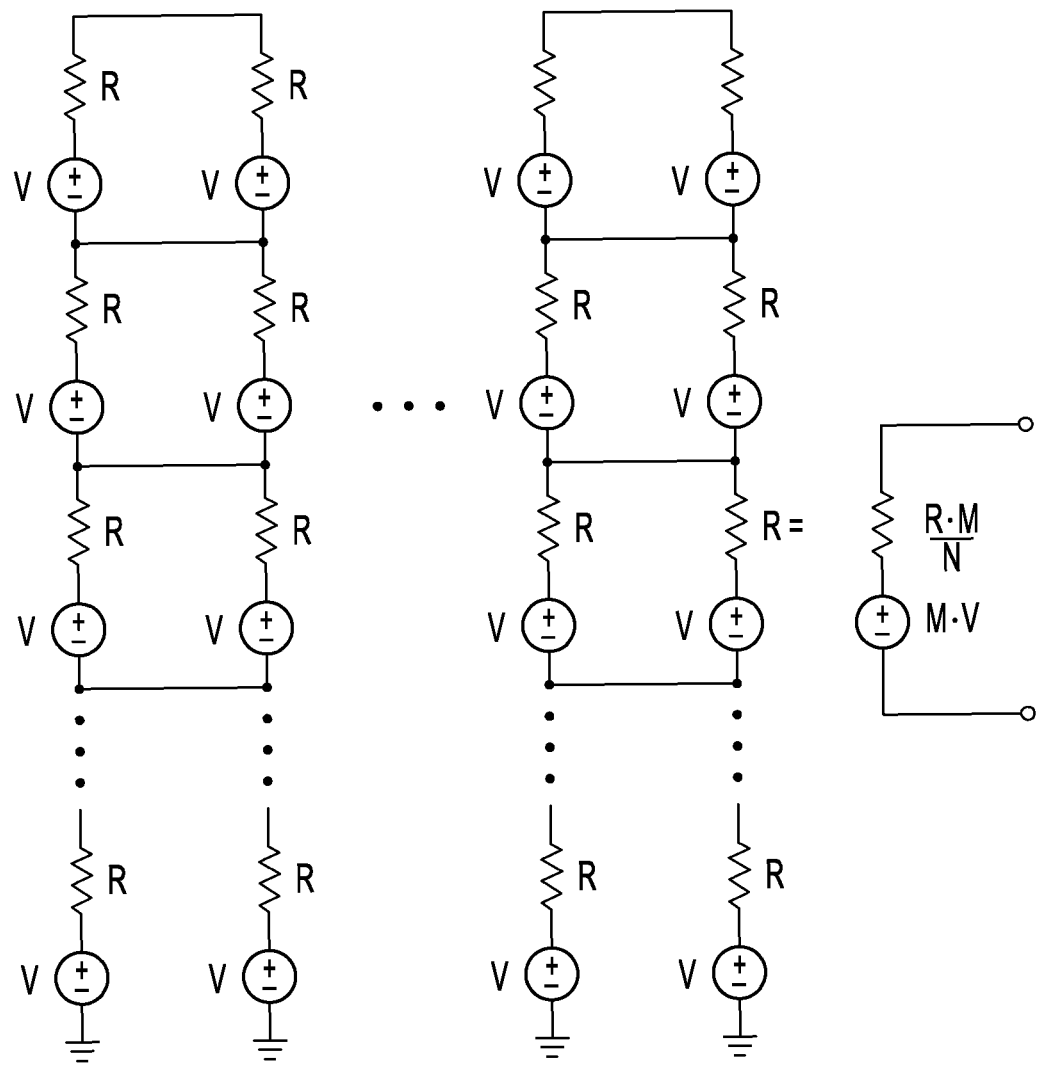
FIG. 6 depicts one electrical connection scheme for an M×N array in accordance to one embodiment.
Figure 7:
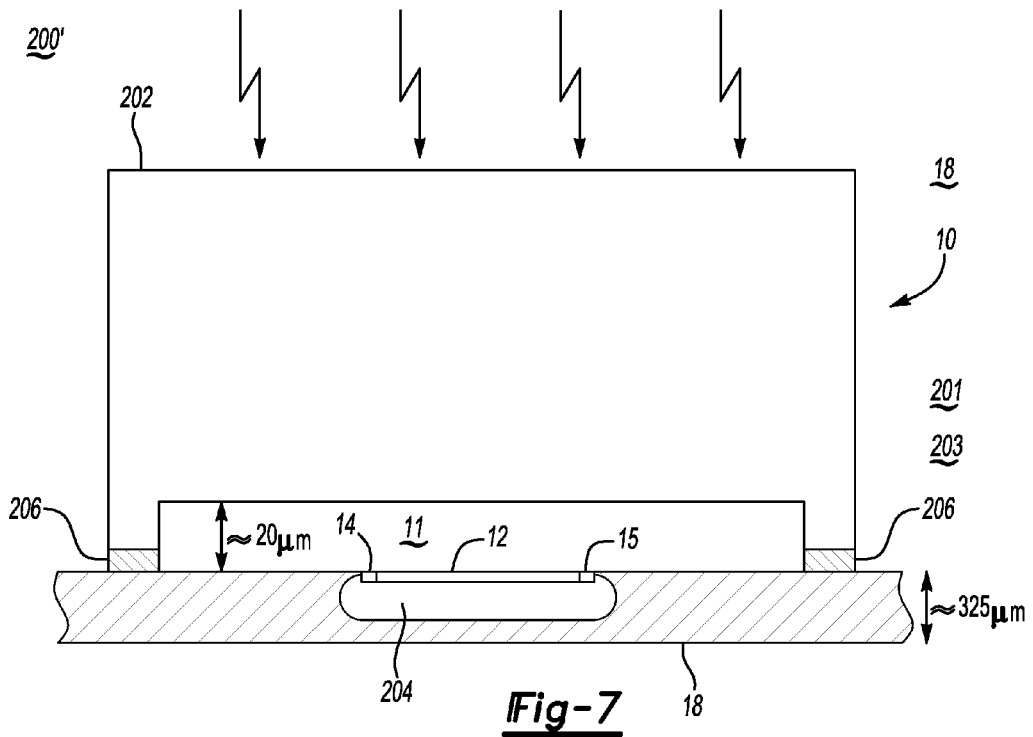
FIG. 7 depicts a detector in an RTEG in accordance to one embodiment.
Figure 8:
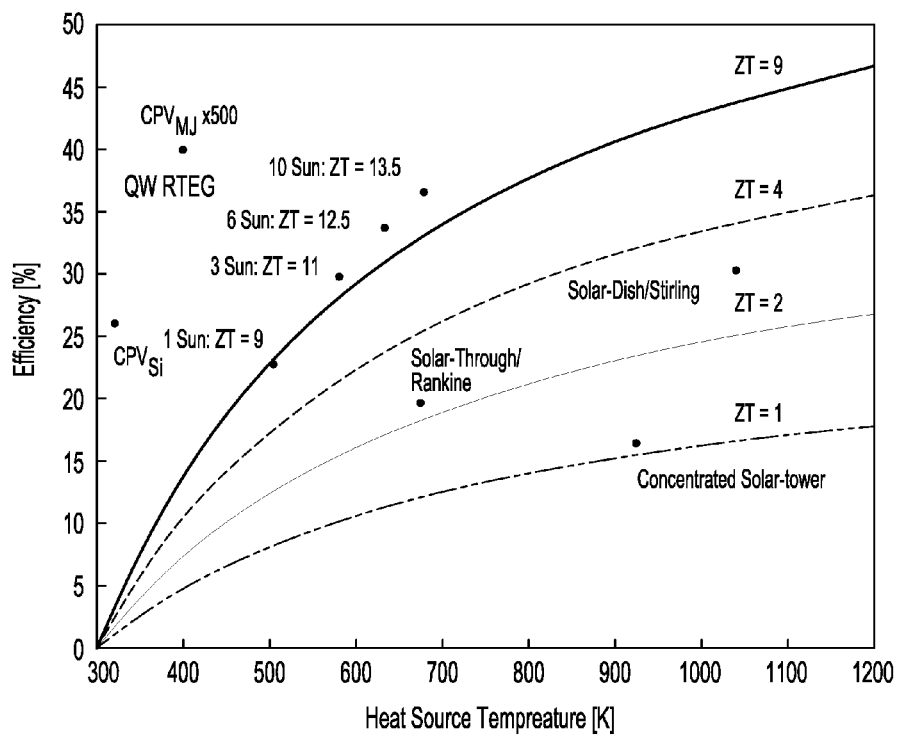
FIG. 8 depicts a spectral distribution of a sun and various hot targets through 5 meters of atmosphere.
Figure 9:
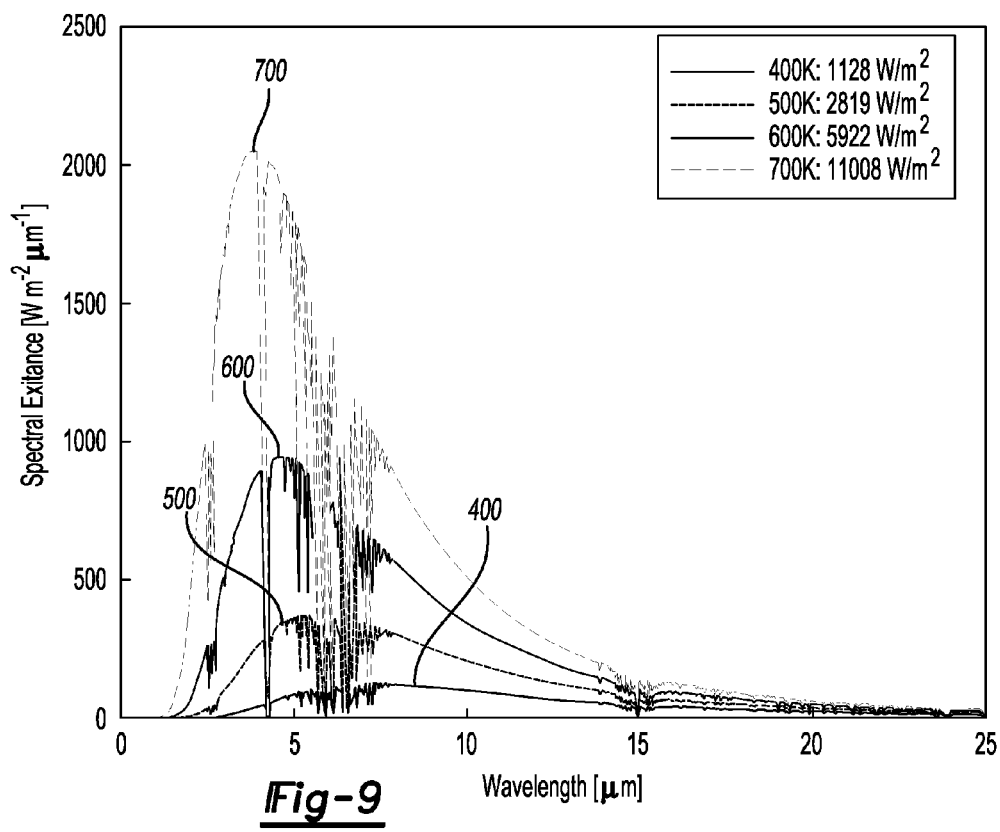
FIG. 9 depicts a spectral excitance of various hot targets through 5 meters of atmosphere.
Figure 10:
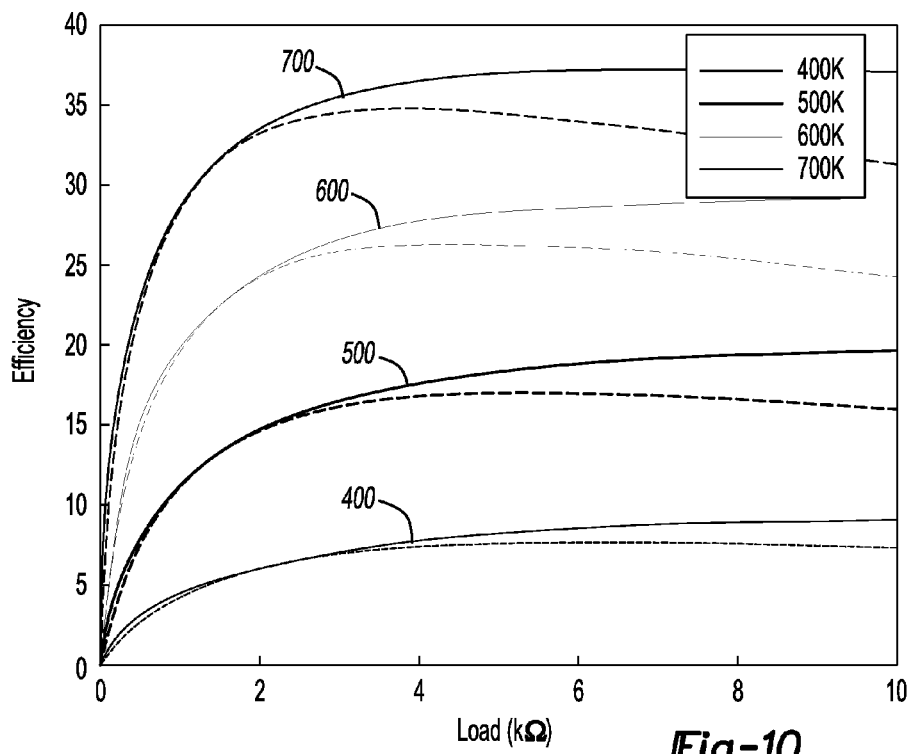
FIG. 10 depicts results from a simulation using parameters from Table 2 for an output from the RTEG.
Figure 11:
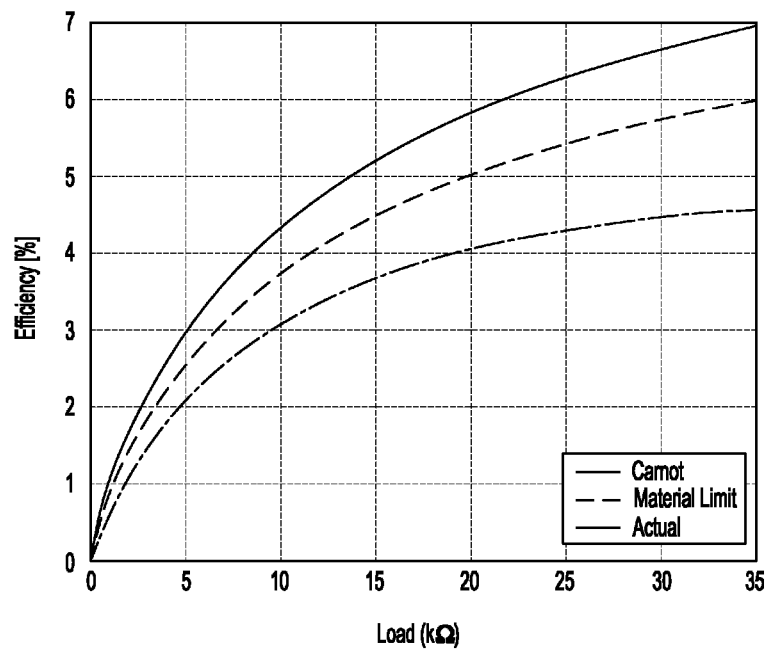
FIG. 11 depicts a computer simulation of the electrical efficiency vs. the load for typical nighttime conditions for the RTEG.
Figure 12:
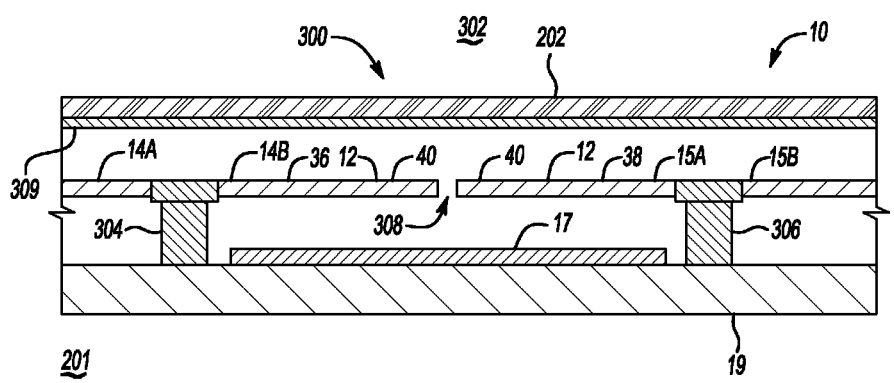
FIG. 12 depicts a side view a TEG using cantilever arms in an unconnected state to a cap in one embodiment.
Figure 13:
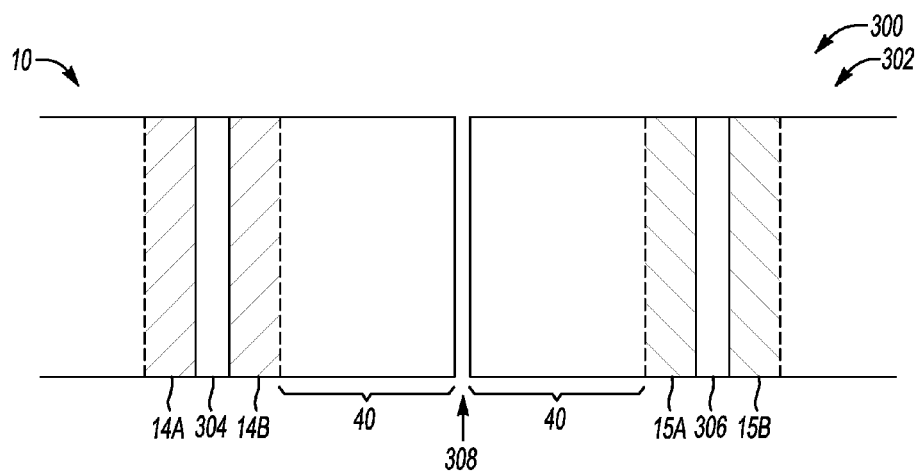
FIG. 13 depicts a top view of the cantilever arms of the TEG in one embodiment.
Figure 14:
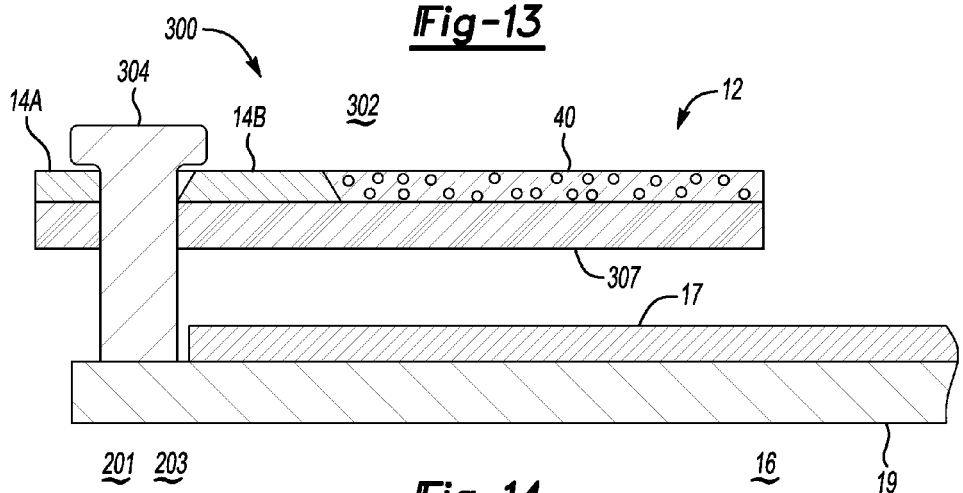
FIG. 14 depicts an enlarged view of the p-type arm which illustrates that it may be made up of a silicon nitride base with the p-type Si/SiGe QW material and a metal film deposited on a top of the silicon nitride for the TEG.
Figure 15:
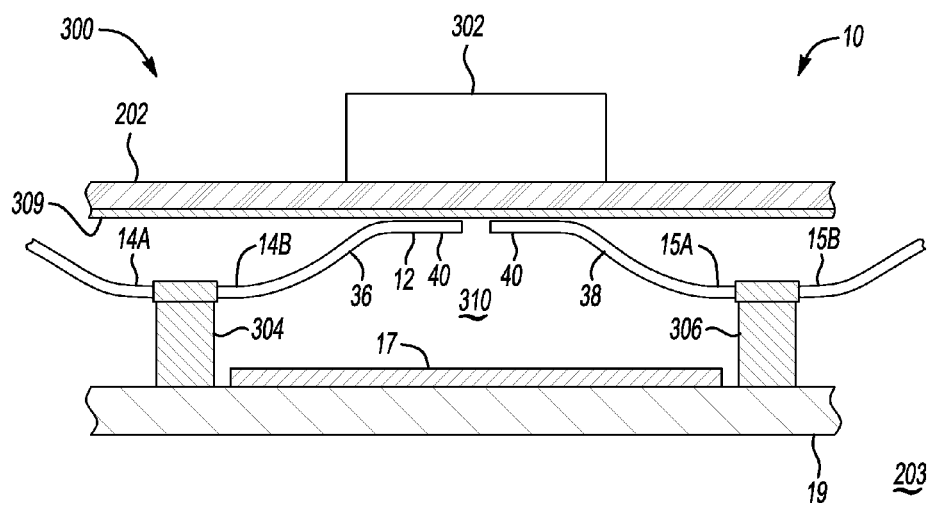
FIG. 15 depicts a side view in which both arms of the detector for the TEG are raised to contact a silicon cap.
Figure 16:
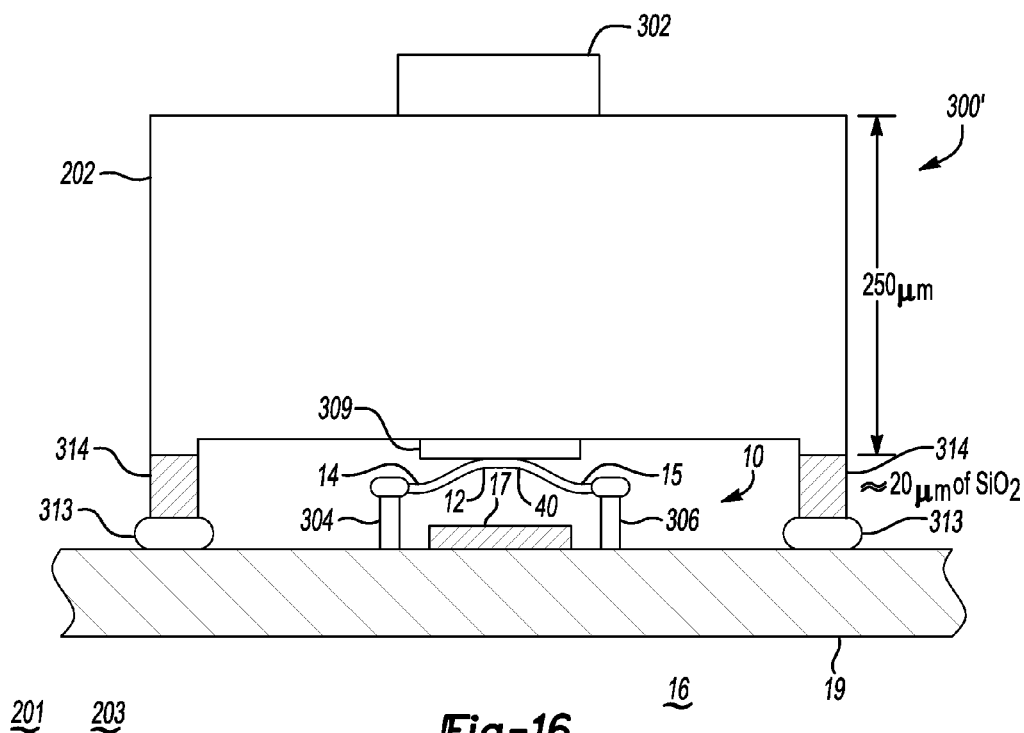
FIG. 16 depicts placement of a layer of $SiO_2$ on the silicon cap.
Figure 17:
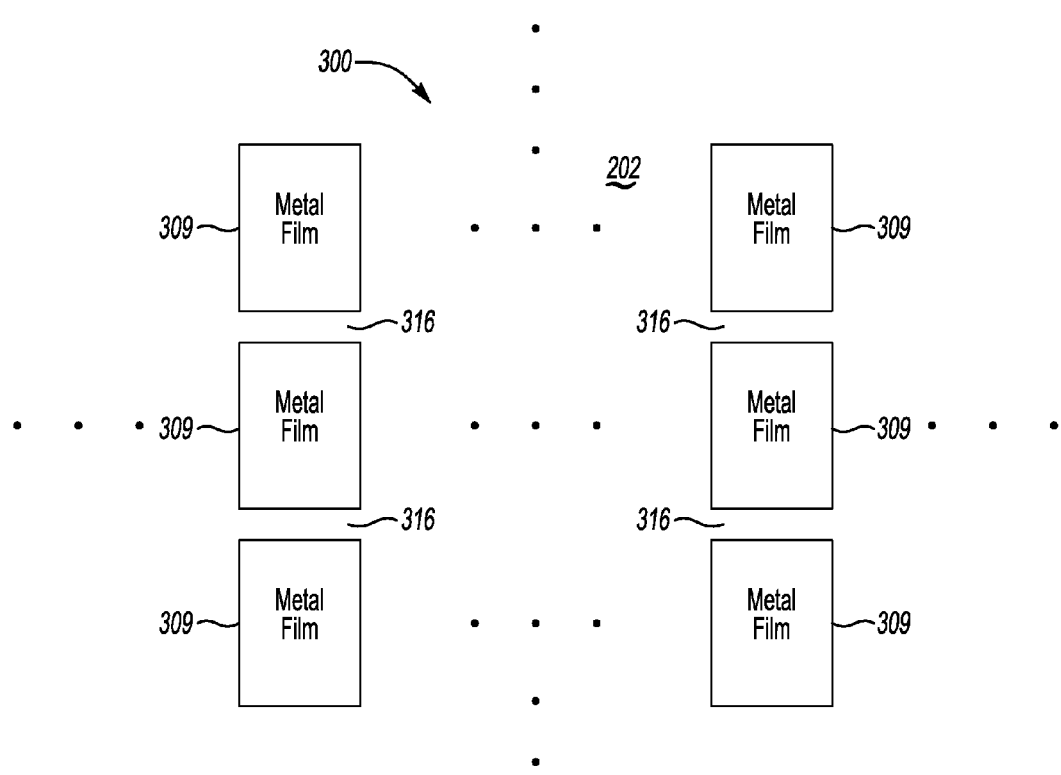
FIG. 17 depicts an example of a metallization pattern that may be applied to the bottom of the silicon cap.
Figure 18:
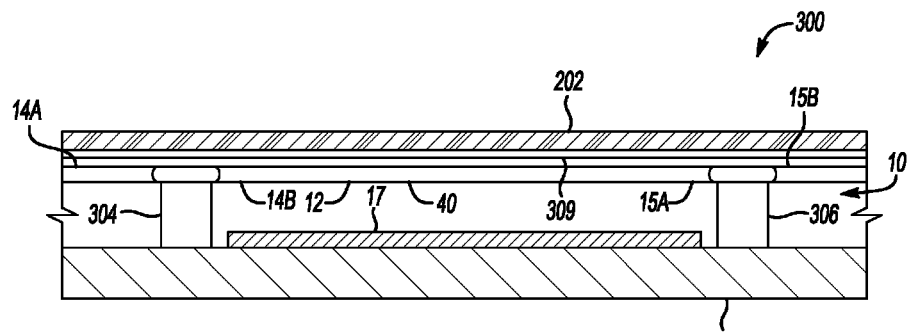
FIG. 18 depicts another approach in which the absorber may be attached to the cap.
Figure 19:
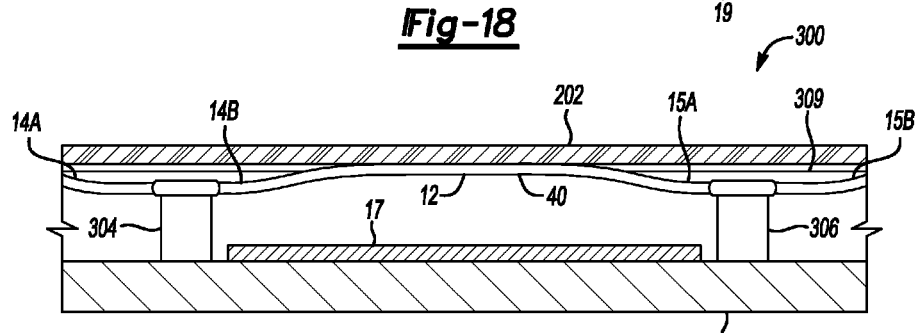
FIG. 19 depicts a side view of the detector of the TEG after attachment.
Figure 20:
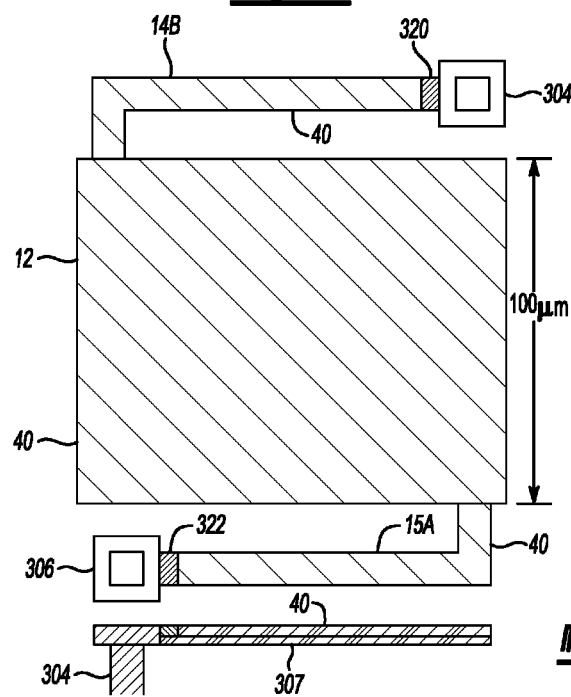
FIG. 20 depicts a top view of another detector design that may be pulled up electrostatically to the cap for attachment.
Figure 21:
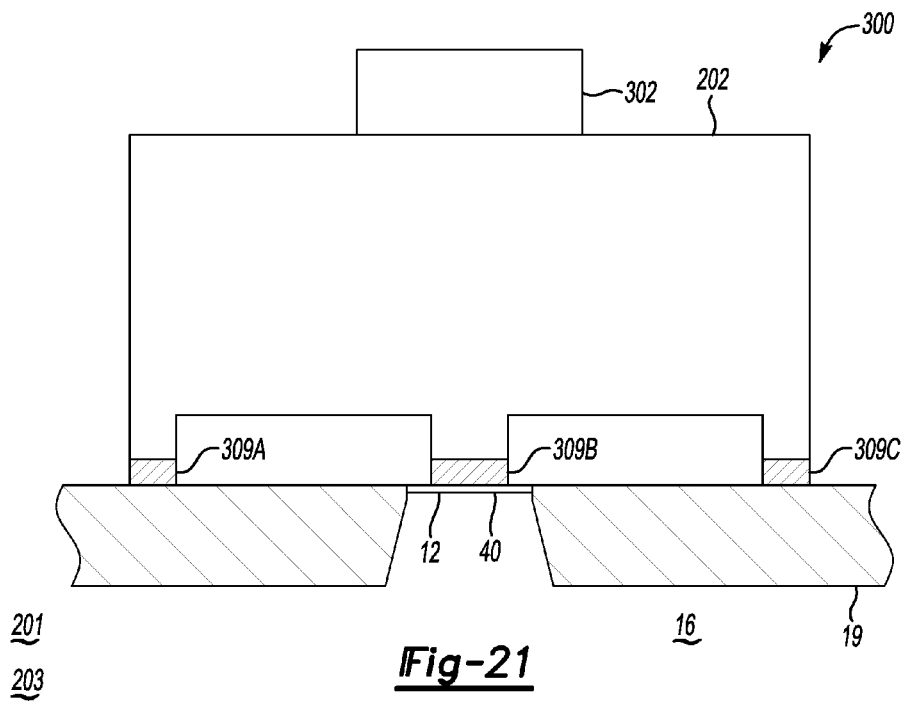
FIG. 21 depicts another TEG implementation in accordance to one embodiment.
Figure 22:
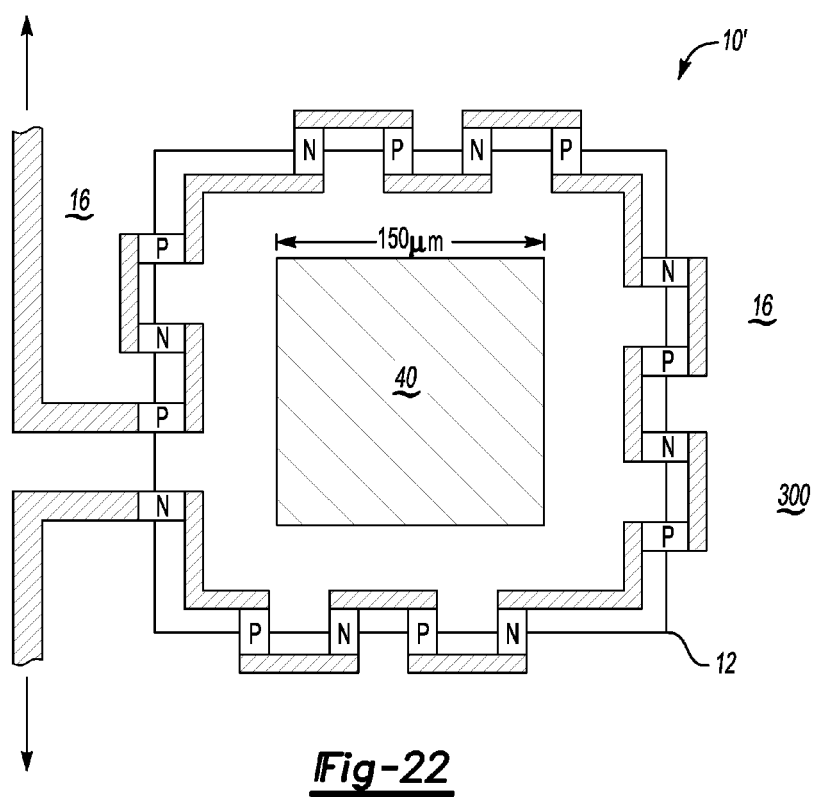
FIG. 22 depicts a top view of the TEG including the thermal detector as set forth in FIG. 2 with the cap being attached.
Figure 23:
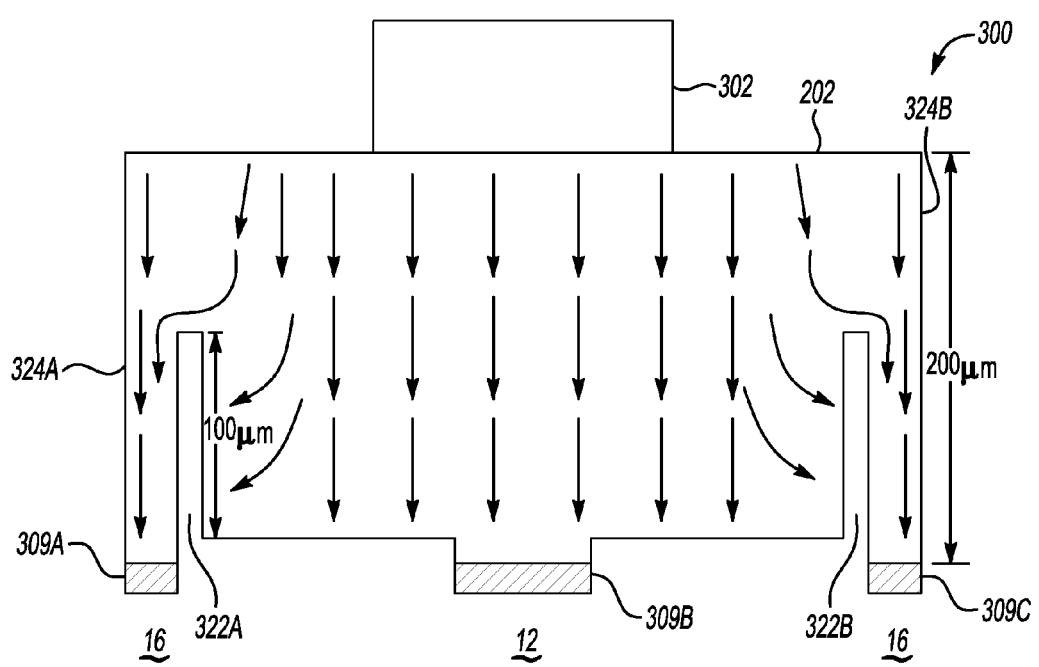
FIG. 23 depicts the addition of a deep trench to the cap in accordance to one embodiment.

FIG. 5 depicts the various stresses caused by the layers of silicon nitride and the superlattice quantum well materials during deposition in one or more of the absorber 12 and/or in the arms 14, 15. For example, materials such as quantum well Si/SiGe when deposited, could be in a state of compressive stress. Under compressive stress, the various layers of Si and SiGe may expand with respect to the substrate 16. In this state of stress, the layers of Si and Si/Ge (either in the absorber 12 and/or in the arms 14, 15) when suspended and attached at two points (e.g., at the posts 22, 30), may buckle over the substrate 16.

The silicon nitride on the other hand, when deposited, could be in a state of tensile strength. Under tensile stress, each layer of silicon nitride may shrink with respect to the substrate 16. In this state of stress, each layer of silicon nitride when suspended and attached at two points (e.g., at the posts 22, 30), may be stretched by the substrate 16. By using predetermined thickness and deposition parameters for the silicon nitride and the quantum well Si/SiGe, a nearly stress free detector may be constructed. In general, due to the fact that the two stresses (e.g., compressive and tensile) are of opposite type, a nearly stress free thin film could be formed by combining the Si and Si/Ge layers to the silicon nitride layers. The thickness for each layer may depend on the magnitude of the stress in each layer.

In general, if the layers (e.g., layers of Si and Si/Ge and silicon nitride) of the detector 10 have equal and opposite stress levels, then the deposition of the layers on top of one another may produce a nearly stress free film. For example, let $\sigma_{m_1}$ represent the stress of material, $m_1$ (e.g., the layers of Si and Si/Ge) and $\sigma_{m_2}$ represent the stress of material, $m_2$ (e.g., the layers of silicon nitride). A material that is in tensile stress may have a positive value and a material in compressive stress may have a negative value. Let $t_1$ represent the thickness for a first set of layers (e.g., Si and Si/Ge) and $t_2$ represent the thickness for a second set of layers (e.g., silicon nitride). In order to produce a stress compensated detector 10, the following equation may need to be satisfied:

$$\sigma_{m_1}t_1 + \sigma_{m_2}t_2 = 0 \quad (3)$$

This expression may be easily generalized to more than two sets of layers.

As noted above, the quantum well Si/SiGe may be in a state of compressive stress when deposited and the silicon nitride may be in a state of tensile stress when deposited, the compressive stress caused by the deposition of the quantum well Si/SiGe may be offset by the tensile stress caused by the deposition of the silicon nitride which may result in a nearly stress free suspended detector implementation.

In general, each layer of SiGe may be n or p-type doped in the absorber 12 and/or in the arms 14, 15. The Si layers may not be doped and are therefore not electrically conductive. The doping concentration of one or more layers of the silicon germanium in the absorber 12 and/or in the arms 14, 15 is roughly between $5 \times 10^{18}$ to $5 \times 10^{19}$ atoms/cm$^3$. The doping concentration may not be the same for the n-type and p-type. The electrical resistance of the n-type arm and p-type arm should be the same to maximize the Seebeck effect this is why the doping concentration of the various layers of silicon germanium is different as it may be adjusted to achieve equivalent arm resistance. Moreover, as the doping concentration moves up, the electrical resistance goes down, but the Seebeck effect also goes down. The optimal doping concentration for the layer of silicon germanium is achieved to ensure that the electrical resistance is the same between the n-type and p-type arm and, moreover, to achieve maximum signal to noise ratio.

The use of the superlattice quantum well based thermoelectric materials in the detector 10 provide for, but not limited to, adequate thermal conductivity, increased Seebeck effect, and low resistivity which may increase detector performance. Encapsulating the superlattice quantum well based materials with silicon based materials (such as silicon nitride and/or silicon oxide or other suitable materials) may increase mechanical strength of the detector 10 and stress compensate offsetting stress caused by the various layers of the superlattice quantum well materials. In short, the present disclosure contemplates that the use of superlattice quantum well thermoelectric materials when combined with silicon based materials in the detector 10 may provide (i) increased detector performance due to the acceptable levels of thermal conductivity, increased Seebeck effect and low resistivity that have been discovered to be found in connection with the superlattice quantum well thermoelectric materials and (ii) increased mechanical strength/stress compensation caused by offsetting stress between the superlattice quantum well thermoelectric materials and the encapsulated silicon based materials.

In addition to the Si/SiGe quantum well system, other quantum well systems such as Si/SiC and $B_4C_4/B_9C_9$ may be used as well.

RTEG

As noted above, the implementation as illustrated in FIGS. 1 and 2 may be used in connection with the RTEG 200. In this case, the RTEG 200 may include a plurality of detectors 10 (or 10') arranged in the M×N array 18 that is encapsulated in the vacuum 11. The RTEG 200 is generally arranged to sense thermal energy that is received directly or indirectly from the sun or other source of radiation to produce electrical energy to power another device 201 and/or to store electrical energy on a storage device 203 such as a battery in response to the thermal energy.

In reference to back to FIG. 1, to maximize the efficiency of the RTEG 200, a vacuum 11 of between 1 and 10 mTorr may be needed to minimize the thermal conductive loss of the heat generated on the absorber 16. Although different contaminant gases may eventually outgas from materials inside the vacuum encapsulated environment, hydrogen is typically the dominant contaminant that may be outgassed from various materials within the vacuum encapsulated environment. In order to maintain a high vacuum environment, a getter (e.g., a material that may absorb the outgassing contaminants) may be placed inside the vacuum encapsulated environment to "get" or "absorb" the contaminant. It is recognized as set forth herein that Palladium and/or certain alloys of Palladium (e.g., Palladium-Silver) (collectively hereinafter "Palladium") may be used within the vacuum encapsulated environment to absorb the hydrogen.

Palladium as a Getter

The reflector 17 may include Palladium and may be placed directly under the absorber 16. The distance between the absorber 16 and the reflector 17 may be the smallest distance between the absorber 16 and the encapsulated environment (e.g., anywhere from 1 to 4 microns depending on the design). Thermal conductance of a gas contaminate, such as hydrogen, may increase as the distance of the absorber 16 and the reflector 17 decreases. In general, as the distance decreases in the presence of gas between the two plates, the thermal conductance increases as the plate separation decreases. As such, it may be preferable to place the Palladium at a point between the absorber 16 and the reflector 17 which provides the smallest distance between the absorber 16 and the reflector 17. In addition, the Palladium (or getter) may cover nearly an entire surface area of the M×N array 18 (e.g., increase surface area of the getter material) such that an increase of the overall effectiveness of the getter may be realized.

In addition to being an excellent hydrogen getter, Palladium (or specular finished Palladium) generally includes a high reflectivity of between 5 and 15 microns (e.g., >98%) thus providing an ideal material for the reflector 17. The "effective" emissivity of the back side of the absorber 16 is given by the following equation:

$$\epsilon_{eff} = \cfrac{1}{\cfrac{1}{\epsilon_{absorber}} + \cfrac{1}{\epsilon_{reflector}} - 1} \quad (4)$$

In the worst case, where the back side of the absorber's emissivity is unity ($\epsilon_{absorber}=1$), a Palladium based reflector 17 may cause the back of the absorber's effective emissivity to be 0.02 (assuming a 98% reflectance for the Palladium and using $\epsilon_{reflector}=1-0.98=0.02$) which may maintain a high temperature of the absorber 16 and may increase the electrical generation efficiency of the RTEG 200.

In addition to Palladium's getter and reflective properties, Palladium's melting temperature, 1555 C is much higher than the Aluminum alloys used for CMOS/MEMS processing (e.g., this is typically around 450 C). Because of the higher melting temperature, the processing steps that deposit the Si/SiGe quantum well materials may be performed at higher temperatures. Such a condition may improve overall RTEG 200 performance when used in connection with the micro-bridge construction technique of detector 10.

What is claimed is:

1. A thermoelectric generator comprising:
a cap configured to be attached to a heat generating device to receive thermal energy therefrom;
an absorber including an active region and being suspended over a first cavity of a substrate to receive the thermal energy and to provide an electrical output to one of store the electrical output on a storage device and power a first device with the electrical output in response to the thermal energy, and
a first coupling layer positioned between the cap and the absorber and being configured to couple the cap to the absorber and to provide the thermal energy from the cap to the absorber,
wherein the cap includes a first attachment portion integrally formed with the cap,
wherein the first attachment portion is attached to the active region with the first coupling layer,
wherein the first attachment portion protrudes from the cap and extends toward the active region, and
wherein the first attachment portion and the first coupling layer are positioned directly above the active region and the first cavity of the substrate.

2. The thermoelectric generator of claim 1 wherein the active region is directly attached to the first coupling layer and wherein the first coupling layer is directly attached to the first attachment portion when providing the electrical output in response to the thermal energy.

3. The thermoelectric generator of claim 1 wherein the cap includes a second attachment portion and a third attachment portion that are integrally formed with the cap.

4. The thermoelectric generator of claim 3 wherein the second attachment portion protrudes from the cap and extends toward a first end of the substrate, and wherein the second attachment portion is attached to a first end of the substrate with a second coupling layer.

5. The thermoelectric generator of claim 4 wherein the cap, the substrate, the first attachment portion, and the second attachment portion define a second cavity positioned directly adjacent to a first side of the first attachment portion.

6. The thermoelectric generator of claim 5 wherein the third attachment portion protrudes from the cap and extends toward a second end of the substrate, and wherein the third attachment portion is attached to a second end of the substrate with a third coupling layer.

7. The thermoelectric generator of claim 6 wherein the cap, the substrate, the first attachment portion, and the third attachment portion define a third cavity positioned directly adjacent to a second side of the first attachment portion.

8. A thermoelectric generator comprising:
a cap configured to be coupled to a heat generating source to receive thermal energy therefrom;
an absorber including an active region to receive the thermal energy and to provide an electrical output to one of store the electrical output on a storage device and power a first device with the electrical output in response to the thermal energy;
a first coupling layer positioned between the cap and the active region and being configured to couple the cap to the active region and to provide the thermal energy from the cap to the active region; and
a substrate defining a first cavity to receive the absorber, wherein the cap includes a first attachment portion that is integrally formed with the cap,
wherein the first attachment portion is attached to the active region with the first coupling layer,
wherein the first attachment portion protrudes from the cap and extends toward the active region, and
wherein the first attachment portion and the first coupling layer are positioned directly above the active region and the first cavity of the substrate.

9. The thermoelectric generator of claim 8 wherein the active region is directly attached to the first coupling layer and wherein the first coupling layer is directly attached to the first attachment portion to receive the thermal energy from the cap when providing the electrical output in response to the thermal energy.

10. The thermoelectric generator of claim 8 wherein the cap includes a second attachment portion and a third attachment portion that are integrally formed with the cap.

11. The thermoelectric generator of claim 10 wherein the second attachment portion protrudes from the cap and extends toward a first end of the substrate, and wherein the second attachment portion is attached to a first end of the substrate with a second coupling layer.

12. The thermoelectric generator of claim 11 wherein the cap, the substrate, the first attachment portion, and the second attachment portion define a second cavity positioned directly adjacent to a first side of the first attachment portion.

13. The thermoelectric generator of claim 12 wherein the third attachment portion protrudes from the cap and extends toward a second end of the substrate, and wherein the third attachment portion is attached to a second end of the substrate with a third coupling layer.

14. The thermoelectric generator of claim 13 wherein the cap, the substrate, the first attachment portion, and the third attachment portion define a third cavity positioned directly adjacent to a second side of the first attachment portion.

15. A thermoelectric generator comprising:
a cap configured to be coupled to a heat generating source to receive thermal energy therefrom;
an absorber including an active region to receive the thermal energy and to provide an electrical output in response to the thermal energy;
a first coupling layer positioned between the cap and the active region and being configured to couple the cap to the active region and to provide the thermal energy from the cap to the active region and
a substrate defining a first cavity to receive the absorber, wherein the cap includes a first attachment portion that is integrally formed with the cap,
wherein the first attachment portion is attached to the active region with the first coupling layer,
wherein the first attachment portion protrudes from the cap and extends toward the active region, and
wherein the first attachment portion and the first coupling layer are positioned directly above the active region and the first cavity of the substrate.

16. The thermoelectric generator of claim 15 wherein the cap includes a second attachment portion and a third attachment portion that are integrally formed with the cap.

17. The thermoelectric generator of claim 16 wherein the second attachment portion protrudes from the cap and extends toward a first end of the substrate, and wherein the second attachment portion is attached to a first end of the substrate with a second coupling layer.

18. The thermoelectric generator of claim 17 wherein the cap, the substrate, the first attachment portion, and the second attachment portion define a second cavity positioned directly adjacent to a first side of the first attachment portion.

19. The thermoelectric generator of claim 18 wherein the third attachment portion protrudes from the cap and extends toward a second end of the substrate, and wherein the third attachment portion is attached to a second end of the substrate with a third coupling layer.

20. The thermoelectric generator of claim 19 wherein the cap, the substrate, the first attachment portion, and the third attachment portion define a third cavity positioned directly adjacent to a second side of the first attachment portion.

* * * * *